(12) United States Patent
Rathmell

(10) Patent No.: US 7,102,146 B2
(45) Date of Patent: Sep. 5, 2006

(54) DOSE CUP LOCATED NEAR BEND IN FINAL ENERGY FILTER OF SERIAL IMPLANTER FOR CLOSED LOOP DOSE CONTROL

(75) Inventor: Robert D. Rathmell, Murphy, TX (US)

(73) Assignee: Axcelis Technologies, Inc., Beverly, MA (US)

( * ) Notice: Subject to any disclaimer, the term of this patent is extended or adjusted under 35 U.S.C. 154(b) by 45 days.

(21) Appl. No.: 10/860,451

(22) Filed: Jun. 3, 2004

(65) Prior Publication Data
US 2005/0269526 A1   Dec. 8, 2005

(51) Int. Cl.
G21G 5/10 (2006.01)

(52) U.S. Cl. .............................. 250/492.21; 250/492.1

(58) Field of Classification Search ........... 250/492.21, 250/397, 492.2
See application file for complete search history.

(56) References Cited

U.S. PATENT DOCUMENTS

| | | | |
|---|---|---|---|
| 4,587,433 A | | 5/1986 | Farley |
| 4,751,393 A | * | 6/1988 | Corey et al. .............. 250/492.2 |
| 6,323,497 B1 | * | 11/2001 | Walther ................. 250/492.21 |
| 6,441,382 B1 | | 8/2002 | Huang |
| 6,489,622 B1 | * | 12/2002 | Chen et al. ............. 250/492.21 |
| 6,541,780 B1 | * | 4/2003 | Richards et al. ......... 250/492.2 |
| 6,624,081 B1 | * | 9/2003 | Dykstra et al. ............. 438/710 |
| 6,777,696 B1 | * | 8/2004 | Rathmell et al. ...... 250/492.21 |
| 6,946,667 B1 | * | 9/2005 | Chen et al. ............ 250/492.21 |
| 2002/0121613 A1 | | 9/2002 | Scheuer et al. |

(Continued)

FOREIGN PATENT DOCUMENTS

EP   0 964 426 A2   12/1999

(Continued)

OTHER PUBLICATIONS

International Search Report, Int'l Application No. PCT/US2005/019526, Int'l Filing Date Jun. 6, 2005, 3 pgs.

Primary Examiner—Nikita Wells
Assistant Examiner—Johnnie L Smith, II
(74) Attorney, Agent, or Firm—Eschweiler & Associates, LLC

(57) ABSTRACT

An ion implantation system having a dose cup located near a final energy bend of a scanned or ribbon-like ion beam of a serial ion implanter for providing an accurate ion current measurement associated with the dose of a workpiece or wafer. The system comprises an ion implanter having an ion beam source for producing a ribbon-like ion beam. The system further comprises an AEF system configured to filter an energy of the ribbon-like ion beam by bending the beam at a final energy bend. The AEF system further comprises an AEF dose cup associated with the AEF system and configured to measure ion beam current, the cup located substantially immediately following the final energy bend. An end station downstream of the AEF system is defined by a chamber wherein a workpiece is secured in place for movement relative to the ribbon-like ion beam for implantation of ions therein. The AEF dose cup is beneficially located up stream of the end station near the final energy bend mitigating pressure variations due to outgassing from implantation operations at the workpiece. Thus, the system provides accurate ion current measurement before such gases can produce substantial quantities of neutral particles in the ion beam, generally without the need for pressure compensation. Such dosimetry measurements may also be used to affect scan velocity to ensure uniform closed loop dose control in the presence of beam current changes from the ion source and outgassing from the workpiece.

38 Claims, 7 Drawing Sheets

U.S. PATENT DOCUMENTS

| | | | |
|---|---|---|---|
| 2003/0066976 A1* | 4/2003 | Chen et al. | 250/492.21 |
| 2003/0183780 A1* | 10/2003 | Sano et al. | 250/492.21 |
| 2003/0230732 A1* | 12/2003 | Sasaki | 250/492.21 |
| 2004/0056210 A1* | 3/2004 | Scherer | 250/492.1 |
| 2005/0205807 A1* | 9/2005 | Perel et al. | 250/492.21 |

FOREIGN PATENT DOCUMENTS

| | | |
|---|---|---|
| EP | 1 329 938 A2 | 7/2003 |
| JP | 04282547 | 10/1992 |
| JP | 10172501 | 6/1998 |

* cited by examiner

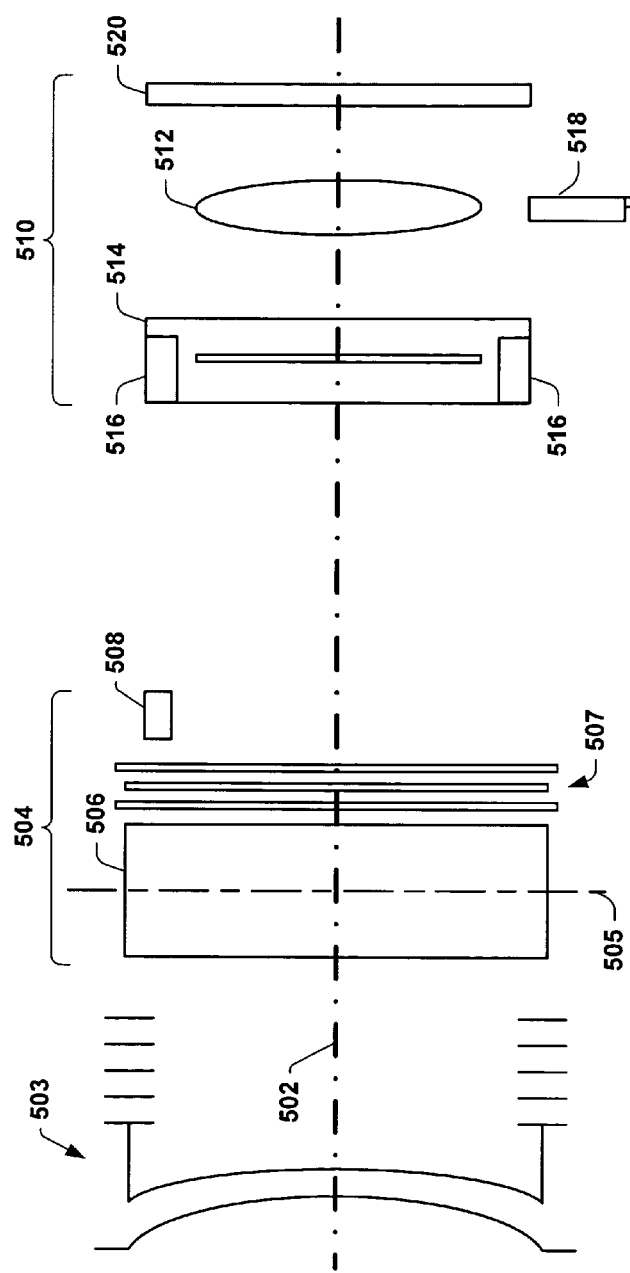
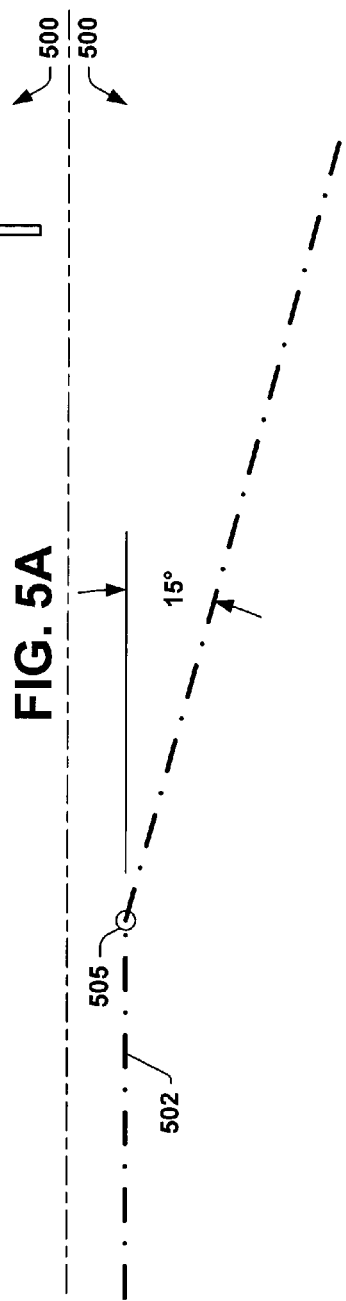
FIG. 5A
FIG. 5B ns in a serial ion implanter.

DOSE CUP LOCATED NEAR BEND IN FINAL ENERGY FILTER OF SERIAL IMPLANTER FOR CLOSED LOOP DOSE CONTROL

FIELD OF THE INVENTION

The present invention relates generally to ion implantation systems, and more particularly to a system and method for ion dose measurement and compensation in the presence of photoresist outgassing, pressure and ion source fluctuations in a serial ion implanter.

BACKGROUND OF THE INVENTION

In the manufacture of semiconductor devices, ion implantation is used to dope semiconductors with impurities. Ion beam implanters are used to treat silicon wafers with an ion beam, in order to produce n or p type extrinsic material doping or to form passivation layers during fabrication of an integrated circuit. When used for doping semiconductors, the ion beam implanter injects a selected ion species to produce the desired extrinsic material. Implanting ions generated from source materials such as antimony, arsenic or phosphorus results in "n type" extrinsic material wafers, whereas if "p type" extrinsic material wafers are desired, ions generated with source materials such as boron, gallium or indium may be implanted.

Typical ion beam implanters include an ion source for generating positively charged ions from ionizable source materials. The generated ions are formed into a beam and directed along a predetermined beam path to an implantation station. The ion beam implanter may include beam forming and shaping structures extending between the ion source and the implantation station. The beam forming and shaping structures maintain the ion beam and bound an elongated interior cavity or passageway through which the beam passes en route to the implantation station. When operating an implanter, this passageway is typically evacuated to reduce the probability of ions being deflected from the predetermined beam path as a result of collisions with air molecules.

The mass of an ion relative to the charge thereon (e.g., charge-to-mass ratio) affects the degree to which it is accelerated both axially and transversely by an electrostatic or magnetic field. Therefore, the beam which reaches a desired area of a semiconductor wafer or other target can be made very pure since ions of undesirable molecular weight will be deflected to positions away from the beam and implantation of other than desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway which will effectively separate ions of different charge-to-mass ratios.

Dosimetry is the measurement of ions implanted in a wafer or other workpiece. In controlling the dosage of implanted ions, closed loop feedback control systems typically are utilized in order to dynamically adjust the implantation to achieve uniformity in the implanted workpiece. Such control systems utilize real-time current monitoring to control the slow scan velocity of an implanter. A Faraday disk or Faraday cup periodically measures the beam current and adjusts the slow scan speed to ensure a constant dose. Frequent measurement allows the dose control system to respond quickly to changes in beam current. The Faraday cup may be stationary, well shielded, and located close to the wafers, making it sensitive to the beam current dosing the wafers. However, Faraday cups measure only the electric current portion of the beam current.

Interactions between the ion beam and gases evolved during implant can cause the electric current, a charge flux, to vary even when the particle current, a dopant flux, is constant. To compensate for this effect, the dose controller may read the beam current from the Faraday cup and the pressure from a pressure gauge concurrently. When a pressure compensation factor is specified for an implantation recipe, the measured beam current is modified by software to present a compensated beam current signal to the circuit controlling the slow scan. The amount of compensation (e.g., in the compensated beam current signal) in such a closed loop system may thus be a function of both the current measured at the Faraday cup and the pressure.

When properly applied, pressure compensation improves repeatability and uniformity over a wide range of implant pressures. However, the vacuum in an implanter is never perfect. There is always some residual gas in the system. Usually the residual gas poses no problems (in fact, a small amount of residual gas is beneficial for good beam transport and effective charge control). However, at high enough pressure, for example, increased pressure due to photoresist outgassing, charge exchange between the ion beam and the residual gas can cause dosimetry errors. If the shift in dose between implants into bare wafers and implants into photoresist-coated (PR) wafers is unacceptably large, or if the dose uniformity is significantly degraded, then pressure compensation may be employed in order to improve uniformity.

Charge exchange reactions between ion beams and residual gas can add or subtract electrons from the ion, changing the ion's charge state from the value desired in the recipe. When the charge exchange reaction is neutralization, a portion of the incident ion flux is neutralized. The result is a reduction in the electrical current while the particle current (including neutrals) remains unchanged. When the charge exchange reaction is electron stripping, a portion of the ion flux loses electrons. The result is an increase in the electrical current while the particle current remains the same.

For typical recipes where charge exchange is an issue, the beam often undergoes much more neutralization than stripping. As a result, the beam current measured by the Faraday cup decreases whenever the end station pressure increases. Ions in the beam are neutralized, but they are not deflected or stopped by the residual gas. The dose rate, dopant atoms per area per time, is unchanged by charge exchange after the analyzer magnet. Implanted neutrals contribute to the dose received by the wafer, but are not measured by the Faraday cup. As a result, the wafer may become overdosed.

Pressure compensation may thus be employed whenever charge exchange between the ion beam and residual gas in the process chamber has a significant effect on dose. The pressure at which this happens depends on the recipe and the process specifications. For some recipes, compensation is required to meet implanter specification when the pressure due to photoresist outgassing is $5 \times 10^{-6}$ torr as measured on the pressure gauge. For most recipes where the pressure due to photoresist outgassing is $2 \times 10^{-5}$ torr or higher, compensation may be worth investigating. Such compensation may include measuring the effect of photoresist outgassing by implanting monitor wafers with and without photoresist, and comparing the measured variation to the process specification. The amount of compensation required depends on the pressure, which the dose controller reads from a pressure gauge during the implant.

In addition, changes in the ion source output itself may result in some of the beam current variations measured at the dose cups. Dose cup measurements of such ion source changes at the wafer are also subject to the proportion of neutral generation to the electric current measured and outgassing pressure changes as discussed. It is necessary to compensate dose rates for the actual change in ion flux at the wafer which requires the system to differentiate between a change in the current caused by a change in source output and a change caused by charge exchange in the gas in the beam path. Therefore, the use of such dose cup measurements to correct or compensate dose rates may be significantly hampered by these variables.

Thus, there is a need for improved systems and methods for obtaining uniform dose rates in ion implanters without the added complications and costs associated with the use of pressure measurements and pressure compensation in the presence of beam current changes from the ion source and outgassing from the wafer.

SUMMARY OF THE INVENTION

The present invention is directed to a system and method for providing an accurate ion current measurement associated with the dose of a wafer for use in an ion implantation system. In accordance with the present invention, the ion implantation system has a dose cup located near a final energy bend of a scanned or ribbon-like ion beam of a serial implanter. The system comprises an ion implanter having a charged particle source for producing a ribbon-like ion beam. The system further comprises an angular energy filter (AEF) system configured to filter an energy of the ribbon-like ion beam using the final energy bend in the ion beam. The AEF system further comprises the AEF dose cup preferably immediately following the final energy bend of the ion beam to provide an accurate measurement of the ion current of the beam. The AEF system directs the beam along a beam path in a downstream direction toward a target wafer held in an end station. The AEF system is defined by a chamber or AEF chamber wherein the AEF components reside upstream of the process chamber or end station. The end station downstream of the AEF system is defined by a chamber wherein the wafer or workpiece is secured in place for movement relative to the ribbon-like ion beam for implanting ions into the wafer.

The AEF system may include pumping that maintains a lower pressure near the AEF than in the end station where the gas is being generated. The AEF system may be separated from the end station chamber by an opening that limits gas flow so as to allow a pressure difference between the AEF chamber and the end station process chamber.

The AEF dose cup in one aspect of the present invention is beneficially located up stream of the end station within the AEF system near the final energy bend to mitigate pressure variations due to outgassing from implantation operations on the wafer. Thus, the system provides accurate ion current measurement before such gases can produce substantial quantities of neutral particles in the ion beam, generally without the need for pressure compensation. Such dosimetry measurements may also be used to affect the scan velocity of the wafer to ensure uniform closed loop dose control in the presence of beam current changes from the ion source and outgassing from the wafer.

In accordance with one aspect of the present invention, the ion beam may comprise a scanned or a continuous ribbon-like beam.

In another aspect of the present invention, the plane of the final energy bend in the ion beam is orthogonal to the plane of the ribbon-like ion beam In accordance with still another aspect of the present invention, the AEF system is located in an AEF chamber region upsteam of the endstation, and the pressure within the AEF chamber is further reduced by a pump, thereby reducing the effect of outgassing and other sources of pressure on the AEF dose cup.

Although in one aspect of the invention the AEF dose cup is located near the final energy bend in the AEF chamber and upstream of the end station and no pressure compensation is employed, in another aspect of the present invention, the ion implantation system further comprises pressure compensation to further refine the AEF dose cup measurements.

In yet another aspect of the present invention, the AEF dose cup is located in an overscan region in relationship to the wafer or workpiece scanned by the ribbon-like ion beam.

In another aspect of the present invention, the readings from a profiler cup at about the plane of the wafer are compared to those of the AEF cup during an implant to deduce the charge exchange rate difference between the two positions, thereby enabling a determination of the number of neutral particles produced over the corresponding path length.

Although some ions will become neutral in transit to the wafer in the system of the present invention, the ion current $I_{measured}$ measured at the AEF dose cup, will be proportional to the particle current $I_{implanted}$ going to the wafer according to:

(1) $I_{implanted} = I_{measured} * C_P * C_{CC}$, where Cp is a factor which corrects for the fraction of beam current which underwent charge exchange to neutrals or higher charge states as defined below, and $C_{CC}$ is a proportionality constant which may be determined during a cup calibration at an initial implant setup for each recipe based on the ratio of current measured at the AEF dose cup relative to the current measured near the plane of the wafer (e.g., as measured by a profile cup at the wafer).

(a) In the case where the pressure in the AEF region remains low enough that charge exchange over the short path between the AEF bend and the AEF cup is a small fraction of the actual current, Cp can be assumed to be =1. This is expected to cover most of the recipes of a medium current tool.

(b) Alternatively, in the case where pressure in the AEF region is high enough to affect $I_{AEF} = I_{measured} * C_{CC}$ enough to require correction, pressure compensation could be used on the AEF cup reading using $Cp = \exp(K*P_{AEF})$ as is done presently on high current tools. In that case K can be determined empirically by plotting the beam current measured in a Faraday cup used for dose control as a function of pressure as the pressure is increased over a range of interest as described in "Two Implant Measurement of Pressure Compensation Factors", Mike Halling, IEEE Proceedings of 2000 International Conference on Ion Implantation Technology, Alpbach, Austria, (2000) 585. The plot of measured beam current vs pressure can be fit to a function of $I_0 = I_{measured} * \exp(K*P)$, where $I_0$ is the current at zero pressure and K is the factor that best fits the data.

(c) A third alternative is to use the difference in current between the AEF cup and the cup in the end station to compensate for charge exchange. In this case, $$Cp=1+((I_{AEF}-I_{ES})/I_{AEF})*(L_{AEF}/(L_{ES}-L_{AEF}))*(P_{AEF}/P_{ES}), \text{ where}$$

$I_{AEF}$ is the current measured by the AEF cup corrected by setup cup calibration $I_{ES}$ is the current measured by the End Station cup corrected by setup cup calibration $L_{AEF}$ is nominally the distance from the AEF bend to the AEF cup $L_{ES}$ is nominally the distance from the AEF bend to the End Station cup $P_{AEF}$ is the pressure measured in the AEF chamber $P_{ES}$ is the pressure measured in the End Station This approach enables the AEF cup current to be corrected for the shorter distance over which charge exchange can affect its reading compared to the End Station cup, which is done by the factor, $(L_{AEF}/(L_{ES}-L_{AEF}))$. It also allows for that shorter distance to be corrected for the lower pressure in the AEF region, which is nominally done by the factor, $(P_{AEF}/P_{ES})$. These two factors are applied to the fractional change in beam current between the two cups, $(I_{AEF}-I_{ES})/I_{AEF}$. This approach may provide a non-empirical pressure compensation.

To the accomplishment of the foregoing and related ends, the invention comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIGS. 5A and 5B are schematic top plan and right side views, respectively, of an ion beam path and several possible Faraday cup locations of an ion beam implantation system of the present invention;

DETAILED DESCRIPTION OF THE INVENTION

Figure 1:
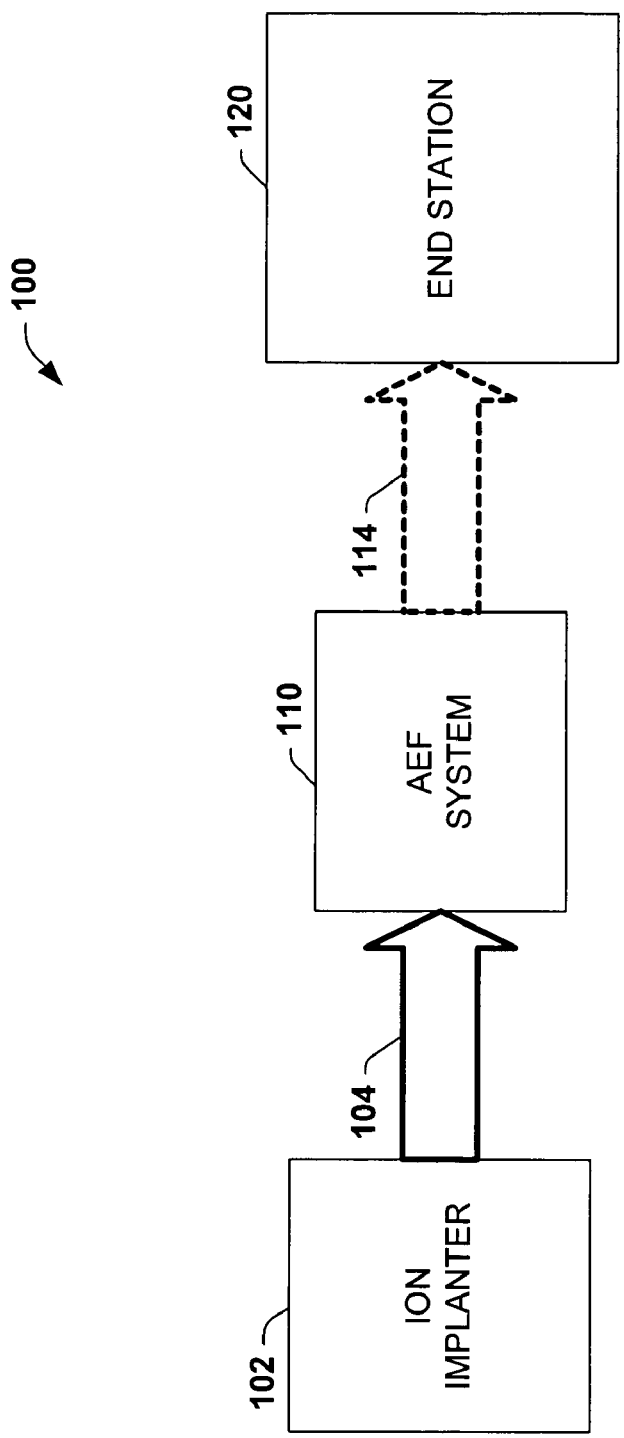
FIG. 1 is a functional block diagram of an ion beam implantation system of the present invention.

The present invention will now be described with reference to the drawings wherein like reference numerals are used to refer to like elements throughout. The invention provides a system and method for providing an accurate ion current measurement associated with the dose of a wafer for use in an ion implantation system. Such use may include dosimetry measurements, data recordings, and feedback to the system for closed loop control of, for example, the velocity of a wafer slow scan motion drive.

Dose control in the presence of high pressures in the process chamber, particularly due to photo-resist outgassing, requires a means of determining the effective implant beam current when some fraction of the beam ions have become neutralized on their path to the wafer. Traditionally this has been accomplished by measuring the pressure in the beam path and correcting the current measured at the wafer in the end station by estimating the fraction that has become neutral based on the pressure and known or empirically determined charge exchange probability. These measurement and estimation techniques are cumbersome, may be expensive, and may introduce additional inaccuracies to the final dose determination, particularly in association with beam current changes from the ion source and outgassing from the wafer.

The ion implantation system of the present invention combines a final energy filter having a final energy bend and a scanned or ribbon-like beam to provide a new beginning point for the ion beam. That is, beginning from the final energy bend, the ion beam is substantially without neutrals in the ion beam that is directed toward the wafer. In accordance with one aspect of the invention, a Faraday dose cup is provided immediately after a final energy bend that is orthogonal to the plane of the ribbon-like beam. In this way, ion current is measured before there is significant opportunity to create neutrals in the path directed toward the wafer. Thus, cup current measurement near the final energy bend eliminates the need for pressure compensation of the measured current in a significant portion of implant conditions. By contrast, dose cups located in the end station or chamber region suffer the substantial deleterious effects of photo-resist outgassing.

Figure 2:
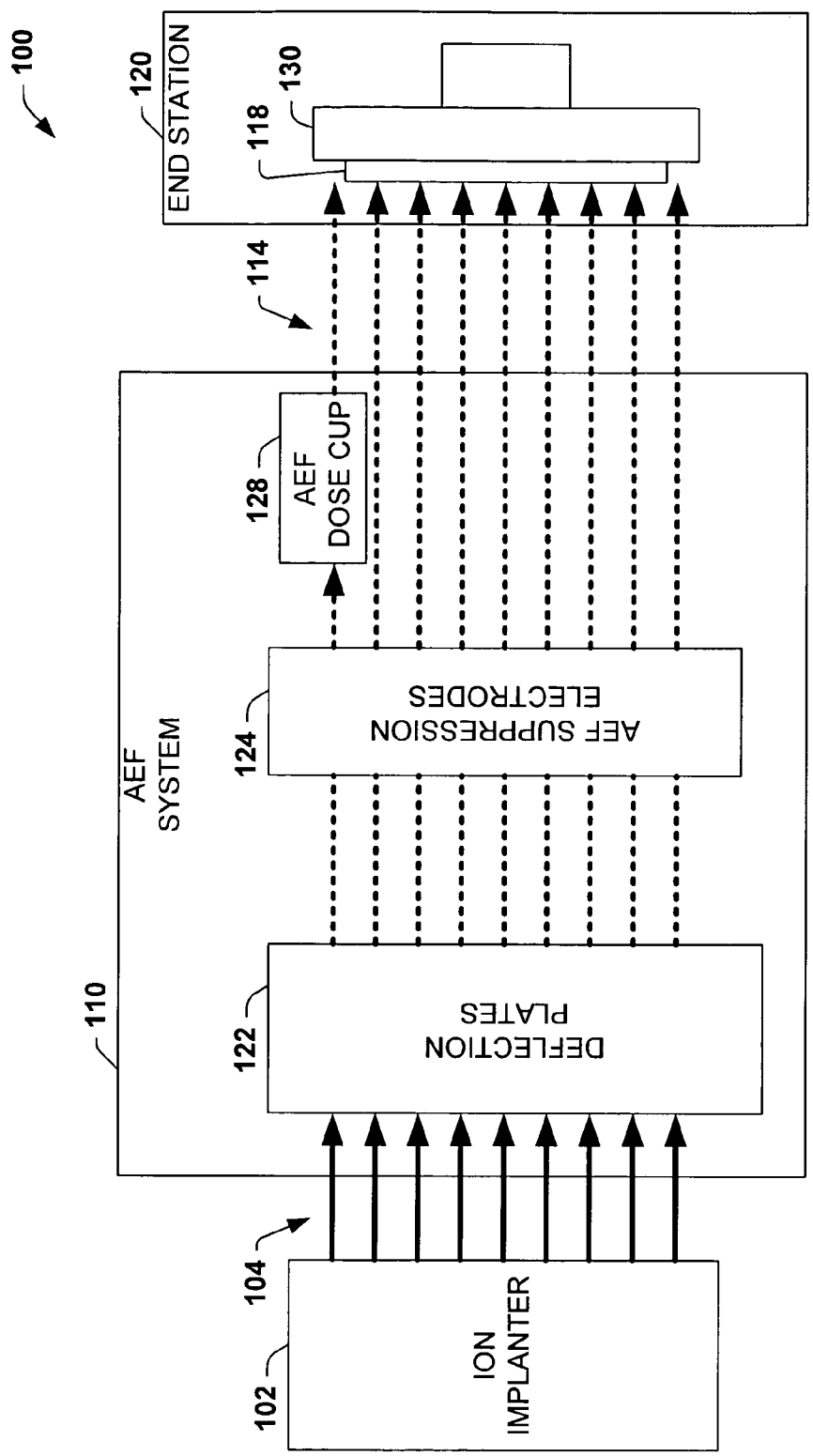
FIG. 2 is a top plan view of selected components and a scanned or ribbon-like ion beam of the ion beam implantation system of FIG. 1.

Referring now to the drawings, FIGS. 1 and 2 illustrates an ion beam implantation system shown generally at 100, in which the various aspects of the present invention may be implemented. The system 100 includes an ion implanter 102 for providing ions that form a scanned or ribbon-like ion beam 104 that traverses a beam path through an angular energy filter (AEF) system 110 using a final energy bend to filter and redirect the ions of a final energy ion beam 114 for implantation into a workpiece or wafer 118 at end station 120. In the present invention, the terms wafer and workpiece will be used interchangeably.

The AEF system 110 comprises a pair of deflection plates 122 that electrostatically (or alternately magnetically) bend charged ions of the scanned or ribbon-like ion beam 104 to produce the resultant ion beam 114 at a selective final energy. Suppression electrodes 124 of the AEF system 110, terminate the potential field of a positive charged deflection plate so electrons are not pulled from the end station 120. The AEF system 110 further comprises an AEF dose cup 128 immediately following the final energy bend of the ion beam to accurately measure the ion current. The final energy bend of the AEF system further serves to direct the energy filtered beam 114 along a beam path in a downstream direction toward the target wafer 118 held by an electrostatic clamp 130 in end station 120.

Figure 3:
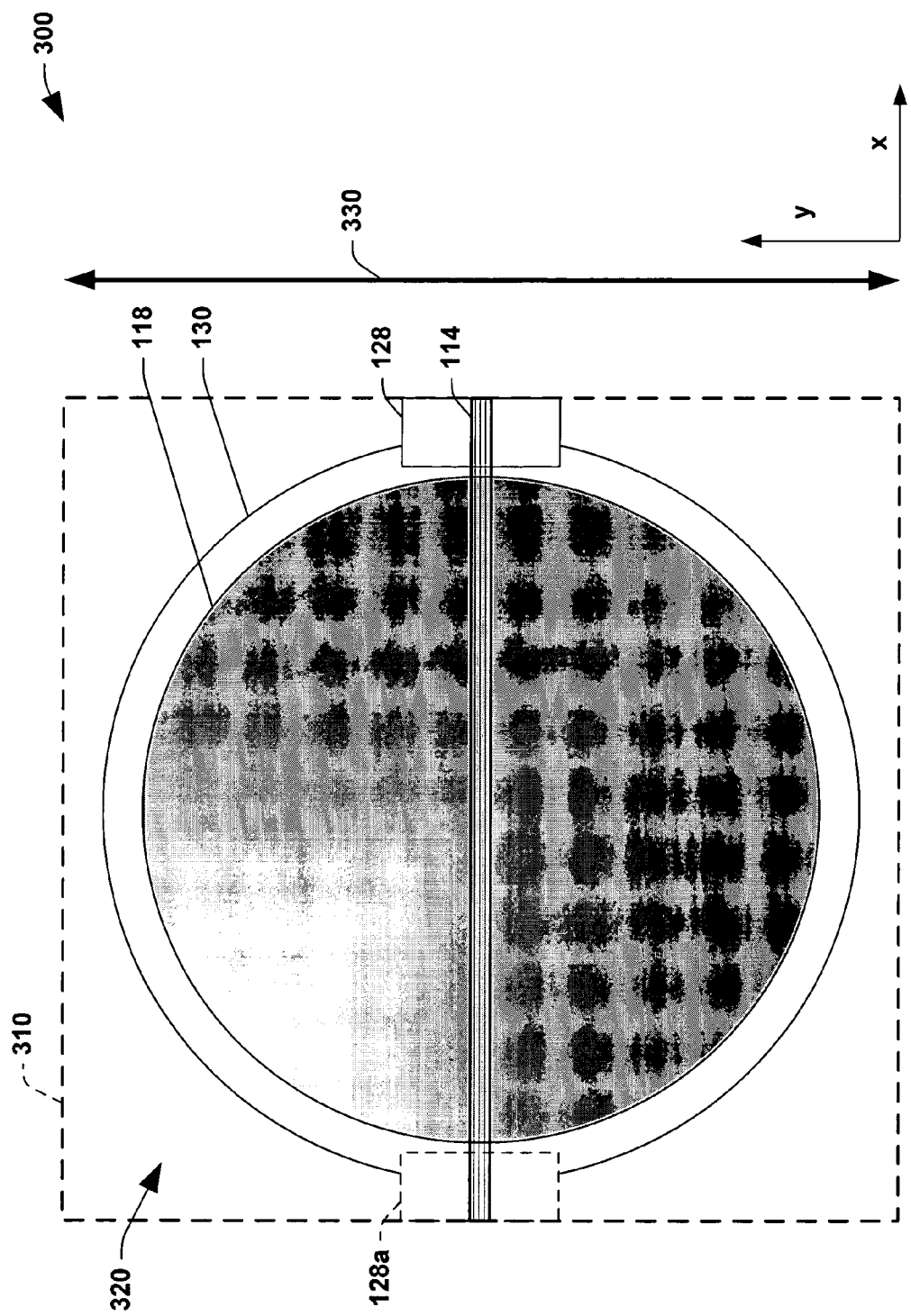
FIG. 3 is an ion beam path view of selected components and a region scanned by the ion beam of the implantation system of FIGS. 1 and 2.

FIG. 3 illustrates a diagram 300 of several system components and a region scanned by the ion beam of the implantation system of FIGS. 1 and 2 as viewed from the energy filtered ion beam 114. The ribbon-like ion beam 114 impacts the wafer 118, held to, for example, a translating disk-shaped electrostatic clamp 130 within the end station 120 or another such implantation chamber. Although a translating clamp 130 is disclosed, it should also be appreciated that the present invention is equally applicable to several types of clamp motions, including rotation, translation, and that of a "serial" ion beam implanter, that is, one in which the ion beam 114 is directed to scan over the surface of a stationary workpiece 118. The translating "slow scan" or "y" motion 330 of the wafer 118, together with the "x" width of the scanned or ribbon-like ion beam 114 provides a larger scanned region 310, which encompasses the entire wafer 118. The area not used or scanned by the wafer is termed an overscan region 320 which may be useful for dose measurements.

In accordance with the present invention, immediately after the final energy bend, the ribbon-like ion beam 114 also impacts the AEF dose cup 128 of FIG. 2 enroute to the wafer 118. FIG. 3 illustrates that AEF dose cup 128 makes use of the overscan region 320, and thus does not interfere with the beam striking the workpiece. Unlike conventional systems that have the dose cup at, near, or beyond the wafer, the ion implantation system 100 of the present invention provides the AEF dose cup 128 of the AEF system 110 within an AEF chamber, well upstream of the end station or implantation chamber, thereby mitigating the outgassing and ion exchange issues discussed. In addition, by having the dose cup 128 immediately after the final energy bend, neutral ions have been removed from the beam and very little neutralization of the beam has yet to occur, thereby making the measured electric current an extremely accurate approximation of the implant current. Although AEF dose cup 128 is illustrated on the right side of the ion beam overscan region 320 in this example, it should also be appreciated that in the present invention either left or right sides of the ion beam overscan may be utilized for placement of the AEF dose cup 128, such as dose cup alternate position 128a.

Figure 4:
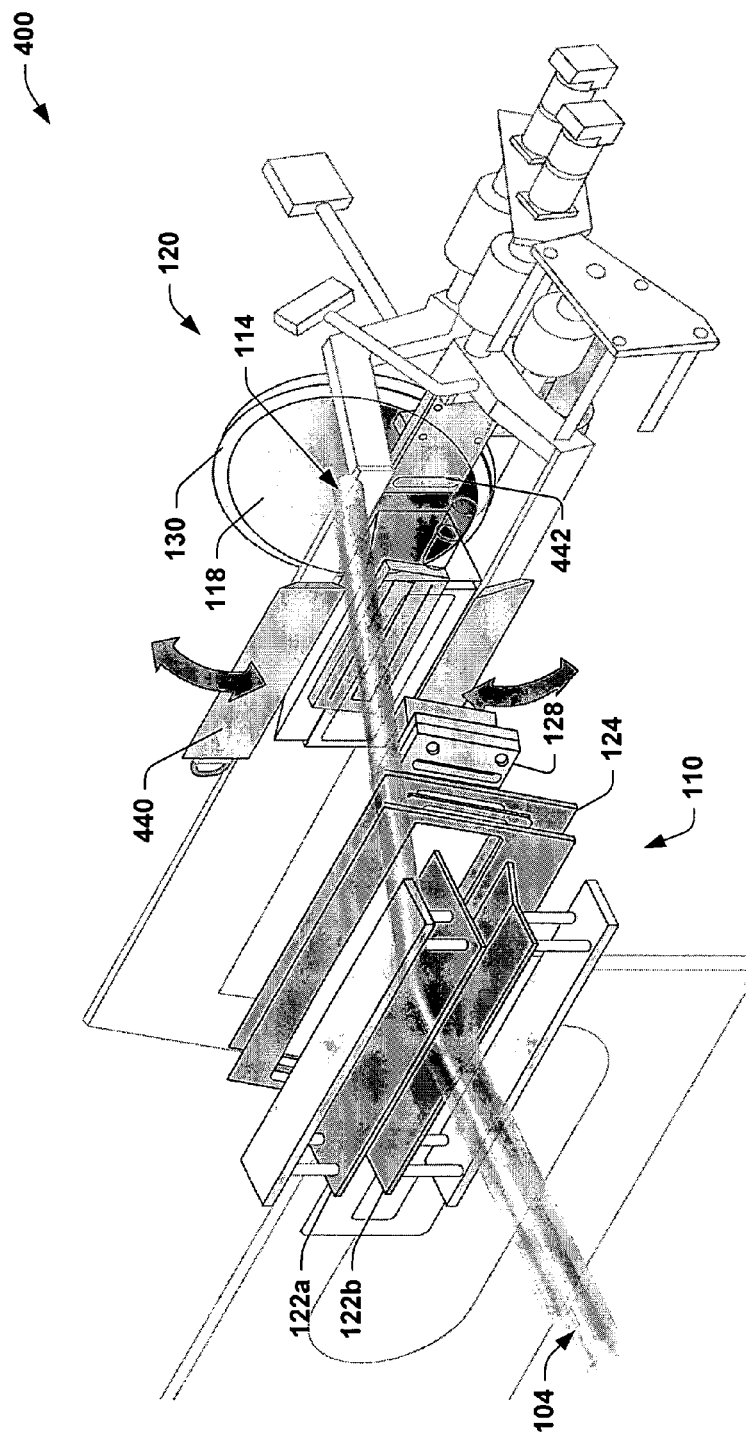
FIG. 4 is a perspective view of selected final energy filter components of an exemplary ion beam implantation system of the present invention.

FIG. 4 illustrates selected final energy filter components of an exemplary ion beam implantation system 400 in accordance with the present invention. An implanter (e.g., 102 of FIGS. 1 and 2) may be used to provide a scanned or ribbon-like ion beam 104. Ion beam 104 enters an angular energy filter AEF system 110, wherein the beam is bent (deflected) between deflection plates 122 that may, for example, comprise a positive potential plate 122a (e.g., +25 kV) and a negative potential plate 122b (e.g., −25 kV). Ion beam 104 then passes through suppression electrodes 124 for termination of the positive potential deflection plate 122a and energy absorption of the neutral portion of the beam. The ion current within ion beam 104 is then measured by the AEF dose cup 128 within the AEF system 110 immediately after the energy bend at plates 122 before being directed downstream toward an end station 120. The AEF dose cup 128 measures the ion current associated with final energy of beam 104 before the beam traverses a significant distance of the beam path toward the workpiece and suffers an ever increasing rate of ion exchange. Thus, a more accurate dose measurement may be obtained relative to that of typical measurements made at or about the vicinity of the wafer.

As AEF dose cup 128 measures the ion current in the overscan region (e.g., 320 FIG. 3), either left or right sides of the ion beam overscan (or both) may be utilized for placement of the dose cup 128, such as dose cup alternate position 128a.

Ion beam implantation system 400 further comprises components within the end station 120 defined by an implantation chamber wall. Energy filter slits 440 further define the height and therefore the energy band of acceptable ions within the ion beam 114 directed toward the wafer 118. A profiler or profiler dose cup 442 at or near the plane of the wafer may be used at implant set-up and for calibration of the system 400.

FIGS. 5A and 5B schematically illustrate top plan and right side views, respectively, of an ion beam path and several possible dose cup locations for monitoring ion current during implant using an ion beam implantation system 500 in accordance with the present invention. System 500 generates a scanned or ribbon-like ion beam 502 from an ion source, wherein the ions of the beam, in one example, are uniformly shaped and accelerated by a P-Lens and acceleration tube 503 to a more energetic state or a less energetic state. Ion beam 502 then enters an angular energy filter system 504 configured to filter an energy of the beam 502. For example, a generally positively charged ion beam 502 is bent (e.g., about nominal bend axis 505) by deflection plates 506 toward the negative deflection plate and away from the positive deflection plate by an angle (e.g., a 15° angle) corresponding to the final energy state and direction desired. Although a 15° deflection angle is illustrated and discussed herein, it should also be appreciated that any such angle and corresponding energy may be used in accordance with the present invention.

After the ion beam has been bent by the deflection plates 506, the beam 502 then passes through suppression electrodes 507 for termination of the positive potential deflection plate (e.g., 122a) and energy absorption of the neutral portion of the beam 502. The ion current within ion beam 502 is then measured by AEF dose cup 508 within the AEF system 504 immediately after being directed in a downstream direction toward an end station 510. The AEF dose cup 508 measures the ion current associated with final energy of beam 502 before the beam traverses a significant distance of the beam path toward the workpiece 512. Following the AEF system 504, the ion beam 502 leaves the AEF system 504 in the AEF chamber section and traverses the beam path downstream entering the end station 510. In the evacuated implantation chamber of the end station 510, the ion beam enters an electron flood assembly (EF) 514 that controls the electron charge on the wafer 512. EF 514 may also optionally, comprise one or more associated dose cups 516, which may be used to monitor overscan current in the end station. Ion beam 502 then impacts the wafer 512, a profiler dose cup 518 for measuring the flux across the wafer 512, and finally a tune flag 520 used to measure the unscanned or scanned beam current while beam optics is being adjusted to the desired value prior to implant.

During setup, just prior to start of implant, current measured in dose cups 508 and 516 are compared to the flux measured by the profile cup 518 as it passes across the scanned beam near the plane of the wafer. Since implant has not yet begun, there is relatively little correction at this time for charge exchange differences between these cups, but the differences in location may result in small differences in current due to flux variations and beam transport differences between the positions of the dose cups and the position of the wafer. The factor $Ccc = I_{P\text{-}cup}/I_{AEF}$ in equation (1) measured during cup calibration corrects for these effects. A similar factor $Ccc'=I_{P\text{-}cup}/I_{ES}$ is used to calibrate the end station cup 516. This correction ensures that currents measured at the dose cups 508 or 516 are scaled appropriately to represent the current at the wafer and useable for accurate dose control in the absence of large pressure changes.

During implant as charged ions traverse the ion beam path 502, they suffer charge exchange collisions with stray gas molecules. Although the effect is minimized in the present invention, some fraction of the ions are neutralized and will not be counted by dose cups 508 or 516. Therefore, the measured ion beam current may not completely reflect the actual dopant flux at the wafer 512. However, one of the methods, a, b, or c described above, can be applied to the AEF dose cup reading during implant to correct for the charge exchange effects on the beam current.

In order to minimize the effect of outgassing at the wafer, the AEF dose cup 508 is located as far as possible from the end station in a part of the system such as the AEF chamber that has a much better vacuum. Still, the fraction of ions made neutral after the bend that contribute to the implanted dose may be accounted for, for example, using the proportionality constant $C_P$ to obtain the actual implanted dose level.

For example, for most implants, the lower pressure rise in the AEF and shorter distance for charge exchange may keep the effects of charge exchange in the AEF dose cup small enough that they can be ignored and Cp=1 gives adequate dose control.

On the other hand, if experience shows that some implants result in a higher level of outgassing such that the pressure in the AEF region is high enough to significantly affect the AEF dose cup reading, this condition can be corrected using either of the two methods of deriving Cp as shown above in (b) and (c). This conclusion may be determined in one of several ways: 1) The dose accumulated in a photo-resist covered wafer may be approximately 1% or more different from a bare wafer implanted by the same recipe. Or, there may be non-uniformity in the dose of a photo-resist covered wafer due to more outgassing which occurs as the beam sweeps across the middle of the wafer compared to the ends of the slow scan where it spends less time on the wafer. 2) A significant change in the reading of the AEF cup current correlated with a change in the AEF pressure during implant would indicate that the current reading is affected by charge exchange rather than source output changes. 3) A large change in the End Station dose cup 516 correlated with a smaller change in the AEF dose cup reading is consistent with charge exchange in this path to the wafer.

Figure 6:
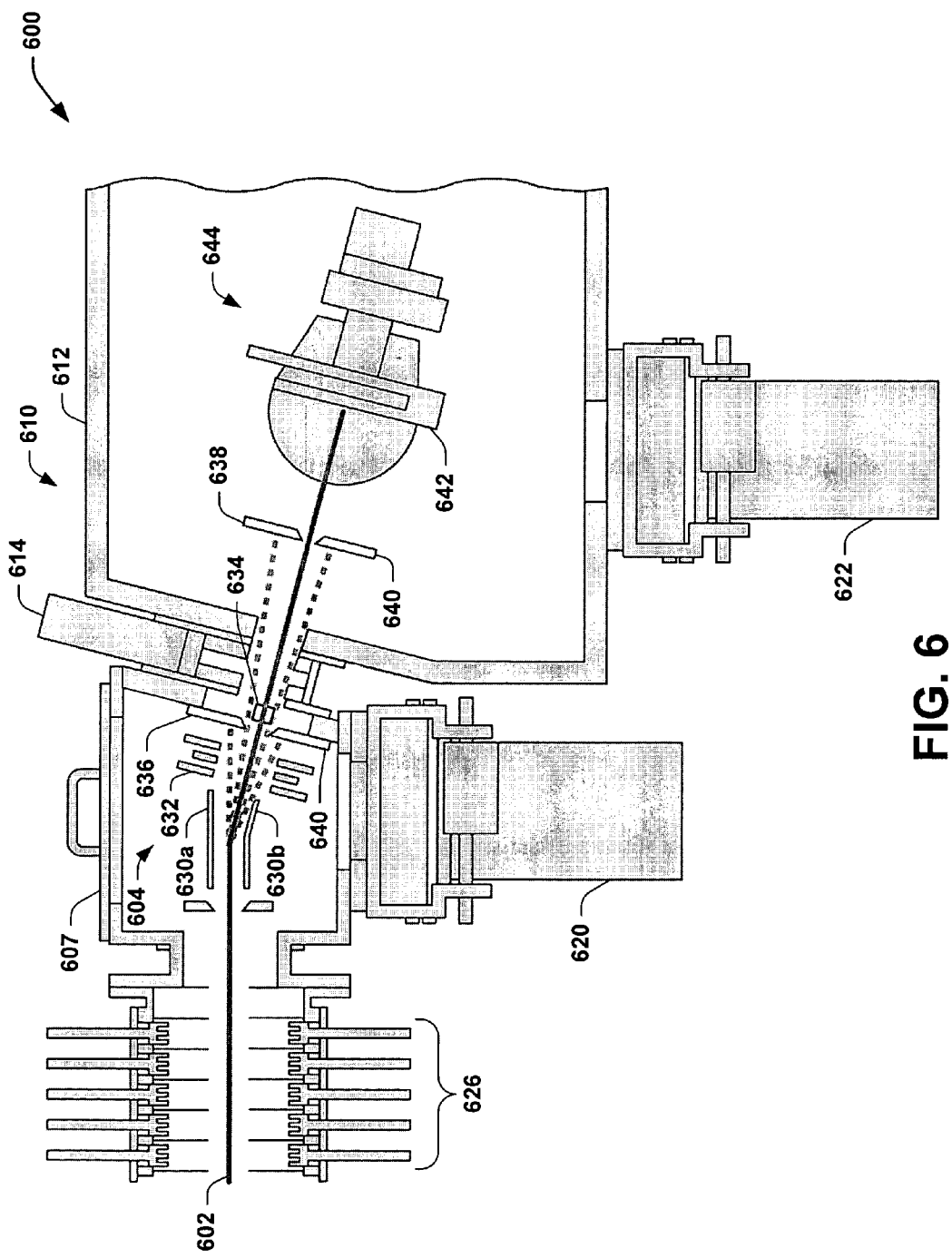
FIG. 6 is a simplified right side view of an ion beam path with a final energy bend, components of an AEF system, and an end station of an exemplary ion beam implantation system of the present invention.

FIG. 6 illustrates another exemplary ion beam implantation system 600 in accordance with the present invention. System 600 further illustrates the path of an ion beam 602 through the system 600 having an angular energy filter system 604 located in a region of an AEF chamber 607 upsteam of the endstation 610 residing within an implantation process chamber 612. The atmosphere within the end station 610 may be isolated from that of the AEF chamber 607 by a vacuum isolation valve 614. During operations, the pressure within one or both of these chambers may be reduced by a vacuum or cryogenic pump, for example, vacuum pump 620 and two cryogenic pumps 622. In one implementation of the present invention, the pressure within the AEF chamber region 607, may be reduced below the pressure of the end station 610, thereby reducing the effect of outgassing and other sources of pressure on the AEF dose cup.

Similar to the previously described systems, system 600 generates a scanned or ribbon-like ion beam 602 from an ion source, wherein the ions are either accelerated or decelerated as desired by acceleration tube 626. Ion beam 602 then enters an angular energy filter system 604 configured to filter an energy of the beam 602. For example, a generally positively charged ion beam 602 is bent by deflection plates 630 away from the positive deflection plate 630a and toward the negative deflection plate 630b by an angle (e.g., a 15° angle) corresponding to the final energy state and direction desired. The ions within ion beam 602 having the desired energy are now deflected in a desired beam path trajectory thru suppression electrodes 632 and to an AEF dose cup 634 of the AEF system 604 located near the AEF bend. The energy of undeflected neutral particles may be absorbed by a neutral beam trap 636 following the suppression electrodes. The AEF dose cup 634 may be located just behind this neutral beam dump. Over-energetic ions are filtered out (trapped) by high energy contaminate dump 638, while under-energetic ions are filtered out by low energy contaminant dump 640 (shown two places).

The resultant ion beam 602 having the desired energy, together with a proportion of neutral particles formed in ion exchanges after the final energy bend, then impacts a wafer 642, held by wafer support structure 644 within the implantation process chamber 612 of the end station 610. The wafer support structure 644 may be utilized to impart rotary and/or translational motion to the wafer relative to the scanned or ribbon-like ion beam 602.

During a production run, that is, when semiconductor wafer workpieces 642 are being impinged upon by the ion beam 602 and thereby being implanted with ions, the ion beam 602 travels through an evacuated path from the ion source (not shown) to the implantation chamber 612, which is also evacuated. The ion beam 602 strikes the wafer workpiece 642 as it rotates and/or translates (e.g., 330 of FIG. 3). In accordance with one aspect of the present invention, the ion dosage received by the workpiece 642 may be determined (at least partially) by the velocity of translation of the support structure 644 under closed-loop control of control electronics (not shown) as provided by feedback from measurements of the AEF dose cup 634.

Figure 7:
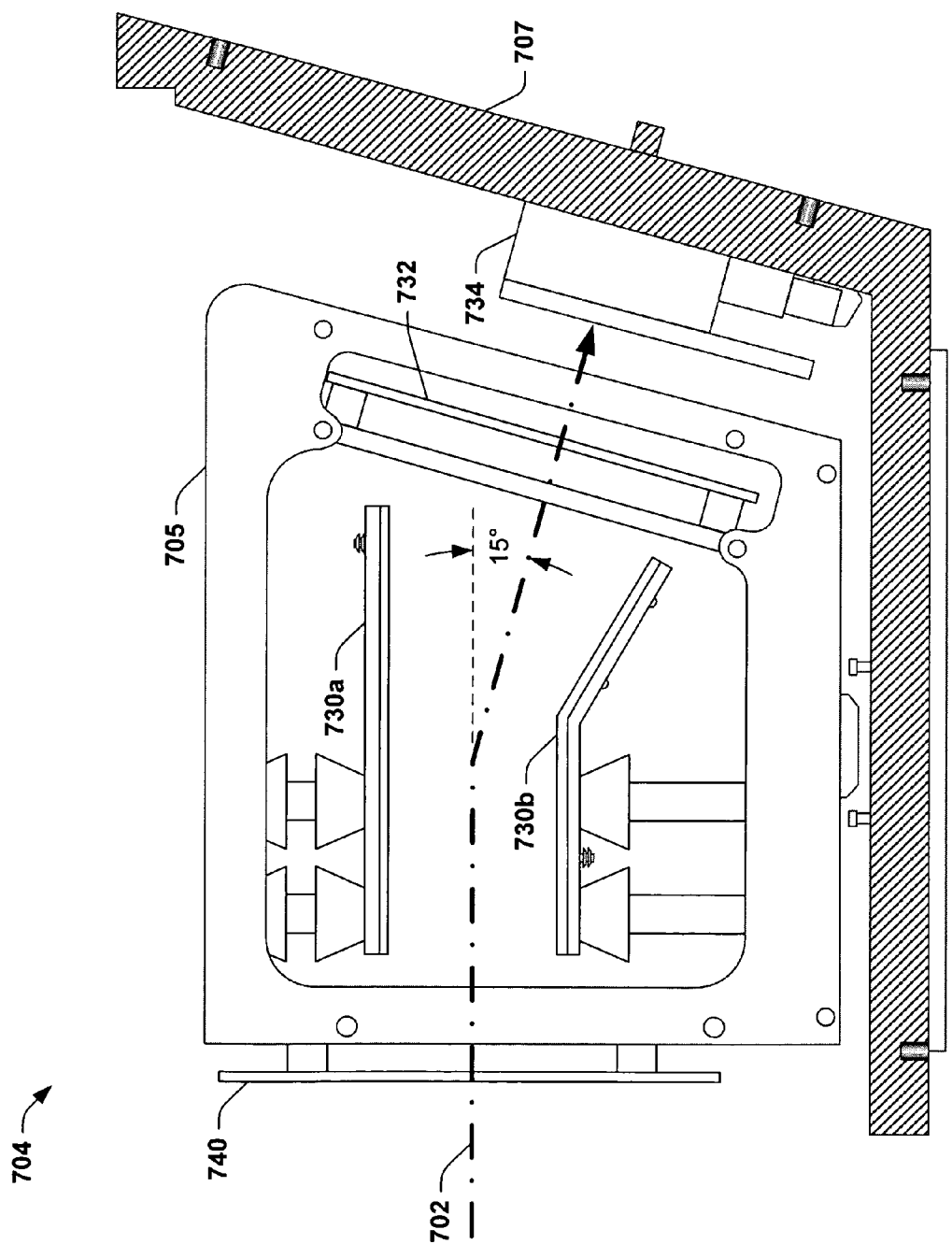
FIG. 7 is a simplified right side view of an exemplary AEF system suitable for use in the ion beam implantation systems of FIGS. 1–6.

FIG. 7 illustrates an exemplary AEF system 704 suitable for use in the ion beam implantation systems of FIGS. 1–6 in accordance with the present invention. AEF system 704 has a mounting 705 which may be mounted on either the right or left hand side of the AEF chamber wall 707. AEF system 704 comprises deflection plates 730 that typically utilize a high voltage potential (e.g., +/−25 kV) on positive and negative deflection plates, 730a and 730b, respectively, to deflect a positively charged ion beam 702 as shown. In the present implementation, ion beam 702 is bent about 15° in a downward direction relative to a horizontal beam path, passing through suppression electrodes 732 to an AEF dose cup 734 before continuing downstream to the end station and the wafer workpiece. Similar to the other components of the AEF system 704, the AEF dose cup 734 may also be affixed to mounting 705 or may be mounted to the side or rear wall of the AEF chamber 707.

A goal of the present invention is to locate the AEF dose cup 734 as near as possible to final energy bend within the AEF system 704, given consideration for other factors such as maintaining uniform deflection fields within the AEF. Accordingly, the purpose of this location is to provide the ions the shortest possible path for ion exchange before the dose measurement is made, and to mount the dose cup 734 in a location that will achieve the best possible vacuum to minimize ion exchange collisions. In addition, it is intended to place the AEF dose cup 734 as far as possible from the wafer, which is a major source of pressure due to photoresist outgassing, thereby minimizing such ion exchange collision opportunities that negatively impact dosimetry. AEF system 704 further comprises another set of suppression electrodes 740 used to suppress electrons from moving from the AEF region toward the acceleration tube.

Thus, in the systems described in the present invention, a dose cup is located near the AEF final energy bend to measure those ions that remain charged long enough to complete the bend in the beam path to the wafer, but before traversing much of that path length. In that way, the current as such a cup becomes proportional to the current going to the wafer and would suffer substantially less charge exchange than the dose cups previously used for that purpose in the end station. The proportionality constant $C_P$ may be determined by one of two disclosed methods to compensate for pressure changes that are large enough to require corrections. Then, during implant, $C_P$ and the AEF dose measurement may be used to determine the actual implanted dose proportional to the AEF dose measurement, as shown in equations (1) above. Thus, as indicated above, other dose cups such as those shown at 516 of FIG. 5A may be unnecessary.

The effect of photoresist outgassing on the AEF dose cup may be further reduced by locating a pump at the AEF chamber (e.g., 607, 707) in order to keep the pressure within the AEF chamber lower than that of the process chamber 612.

Thus, a dose cup located at a final energy bend of a scanned or ribbon-like ion beam may be used for accurate dosimetry measurements or for closed loop dose control. Such control may be used to affect scan velocity to ensure uniform dose in the presence of beam current changes from the ion source output, for example, or in the presence of outgassing from the wafer.

Although the invention has been shown and described with respect to a certain applications and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:
1. An ion implantation system comprising:
   an ion implanter configured to produce a ribbon-like ion beam;
   an AEF system configured to filter an energy of the ribbon-like ion beam by bending the beam at a final energy bend; an AEF dose cup associated with the AEF system, and configured to measure ion beam current substantially immediately following the final energy bend; and
   an end station downstream of the AEF system, the end station defined by a chamber wherein a workpiece is secured in place for movement relative to the ribbon-like ion beam for implantation of ions therein;
   wherein the AEF dose cup is located external to the end station chamber.
2. The system of claim 1, wherein the AEF system comprises:
   a pair of deflection plates to deflect the ion beam by a target angle of deflection, thereby defining a final energy level of the ion beam corresponding to the angle of deflection from an original path;
   a set of suppression electrodes downstream of the deflection plates, the electrodes configured to terminate a positive potential imparted to the ion beam by the deflection plates and a beam dump plate to absorb energy of neutral particles in the beam not deflected by the deflection plates; and
   the AEF dose cup immediately following the final energy bend in the ion beam for measuring the ion current in the beam before a substantial portion of the ion beam can become neutralized.
3. The system of claim 1, wherein the final energy level of the ion beam corresponds to an angle of deflection of about 15 degrees from the original path.
4. The system of claim 1, wherein the AEF dose cup is located in an overscan region in relationship to the area of the workpiece scanned by the ribbon-like ion beam.
5. The system of claim 1, wherein the plane of the final energy bend in the ion beam is orthogonal to the plane of the ribbon-like ion beam.
6. The system of claim 1, wherein the AEF dose cup is located within the AEF system located in an AEF chamber region, wherein a pressure is reduced by a pump below a pressure of the end station downstream from the AEF chamber.
7. The system of claim 1, further comprising a dose compensation control system, wherein the AEF dose cup measurement is used to control the scan velocity of the workpiece across the ion beam.
8. The system of claim 7, further comprising pressure compensation to correct the AEF dose cup measurements, the pressure compensation comprising:
   a pressure sensor operable to measure a pressure associated with the implantation system in the AEF system located external to the end station chamber, the sensor having an output connected to the compensation control system to correct the scan velocity based on the pressure measured;
   one of a compensation circuit, and a compensation software routine adapted to determine a pressure compensation factor as a function of the measured pressure and the measured ion beam current; and
   a scan motion control system operable to control a scan velocity of the workpiece across the ion beam based on the pressure measured and the pressure compensation factor.
9. The system of claim 8, wherein the AEF system is located in an AEF chamber region external to the end station chamber, and wherein the pressure within the AEF chamber is further reduced by a pump below the pressure of the end station chamber downstream from the AEF chamber to further reduce the effect of outgassing and pressure on the AEF cup.

10. The system of claim 1, wherein readings from a dose cup near the workpiece are compared to those of the AEF cup during an implant to deduce the charge exchange rate difference between the two positions, thereby enabling a determination of the number of neutral particles produced over the corresponding path length.

11. The system of claim 1, wherein the ion current measured at the AEF dose cup is proportional to the current going to the workpiece.

12. The system of claim 1, wherein the ion current implanted at the workpiece is determined to be proportional to the current measured in the AEF dose cup by a scaling factor Cp according to the relationship:

$$I_{implanted} = I_{AEF} * C_p.$$

13. The system of claim 12, wherein Cp is calculated based on readings of the AEF cup and an End Station cup to determine the fraction of charge exchange affecting the AEF cup and to compensate the readings for pressure changes.

14. The system of claim 1, wherein the ribbon-like ion beam is a scanned ion beam.

15. The system of claim 1, wherein the ribbon-like ion beam is a continuous ion beam.

16. The system of claim 1, wherein the AEF dose cup measures the ion current associated with final energy of the beam at a location before the beam traverses a greater portion of the distance of the beam path toward the workpiece.

17. The system of claim 16, wherein the AEF dose cup is located nearer to the final energy bend in the ion beam than to the workpiece.

18. The system of claim 1, wherein the AEF dose cup is located nearer to the final energy bend in the ion beam than to the workpiece.

19. The system of claim 16, wherein the AEF dose cup is located at a position wherein measurements of the ion current associated with final energy of the beam are made before the beam has subsequently exchanged a greater portion of the ions of the beam on the path toward the workpiece.

20. The system of claim 1, wherein the AEF dose cup is located at a position wherein measurements of the ion current associated with final energy of the beam are made before the beam has subsequently exchanged a significant portion of the ions of the beam on the path toward the workpiece.

21. An ion implantation system comprising:
   an ion implanter configured to produce one of a scanned or ribbon-like ion beam;
   an AEF system configured to filter an energy of the ion beam by bending the beam at a final energy bend; an AEF dose cup associated with the AEF system, and configured to measure ion beam current, the AEF dose cup located following the final energy bend nearer to the final energy bend than to a workpiece; and
   an end station downstream of the AEF system, the end station defined by a chamber wherein the workpiece is secured in place and provides movement relative to the ribbon-like ion beam for implantation of ions therein;
   wherein the AEF dose cup is located external to the end station chamber.

22. The system of claim 21, wherein the AEF system comprises:
   a pair of deflection plates to deflect the ion beam by a target angle of deflection, thereby defining a final energy level of the ion beam corresponding to the angle of deflection from an original path;
   a set of suppression electrodes downstream of the deflection plates, the electrodes-configured to terminate a positive potential imparted to the ion beam by the deflection plates; and
   the AEF dose cup immediately following the final energy bend in the ion beam for measuring the ion current in the beam before a substantial portion of the ion beam can become neutralized.

23. The system of claim 21, wherein the final energy level of the ion beam corresponds to an angle of deflection of about 15 degrees from the original path.

24. The system of claim 21, wherein the AEF dose cup is located in an overscan region in relationship to the area of the workpiece scanned by the ribbon-like ion beam.

25. The system of claim 21, wherein the plane of the final energy bend in the ion beam is orthogonal to the plane of the ribbon-like ion beam.

26. The system of claim 21, wherein the AEF dose cup is located within the AEF system that is located in a chamber region upstream of the end station, wherein a pressure is reduced by a pump below a pressure of the end station.

27. The system of claim 21, further comprising a dose compensation control system, wherein the AEF dose cup measurement is used to control the scan velocity of the workpiece across the ion beam.

28. The system of claim 27, further comprising pressure compensation to correct the AEF dose cup measurements, the pressure compensation comprising:
   a pressure sensor operable to measure a pressure associated with the implantation system in the AEF system located external to the end station chamber, the sensor having an output connected to the compensation control system to correct the scan velocity based on the pressure measured;
   one of a compensation circuit, and a compensation software routine adapted to determine a pressure compensation factor as a function of the measured pressure and the measured ion beam current; and
   a scan motion control system operable to control a scan velocity of the workpiece across the ion beam based on the pressure measured and the pressure compensation factor.

29. The system of claim 27, wherein an AEF system is located in an AEF chamber region external to the end station chamber, and wherein the pressure within the AEF chamber is further reduced by a pump below the pressure of the end station chamber downstream from the AEF chamber to further reduce the effect of outgassing and pressure on the AEF cup.

30. The system of claim 21, wherein readings from a dose cup near the workpiece are compared to those of the AEF cup during an implant to deduce the charge exchange rate difference between the two positions, thereby enabling a determination of the number of neutral particles produced over the corresponding path length.

31. The system of claim 21, wherein the ion current measured at the AEF dose cup is proportional to the current going to the workpiece.

32. The system of claim 21, wherein the ion current implanted at the workpiece is determined during implant to be proportional to the current measured in the AEF dose cup by a scaling factor Cp according to the relationship:

$$I_{implanted} = I_{AEF} * C_p.$$

33. The system of claim 32, wherein Cp is calculated based on readings of the AEF cup and an End Station cup to determine the fraction of charge exchange affecting the AEF cup and to compensate the readings for pressure changes.

34. The system of claim 21, wherein the ion beam is a scanned ion beam.

35. The system of claim 21, wherein the ion beam is a continuous ribbon-like ion beam.

36. The system of claim 21, wherein the AEF dose cup is located at a position wherein measurements of the ion current associated with final energy of the beam may be made before the beam has subsequently exchanged a greater portion of the ions of the beam on the path toward the workpiece.

37. The system of claim 21, wherein the AEF dose cup is located at a position wherein measurements of the ion current associated with final energy of the beam may be made before the beam has subsequently exchanged a significant portion of the ions of the beam on the path toward the workpiece.

38. A method of dynamically compensating for pressure and ion source variations using an AEF dose cup located near a final energy bend upstream of an end station, the AEF dose cup located external to an end station chamber in an ion implantation system, comprising:

providing a workpiece within the end station chamber having a profiler cup at therein near the plane of a workpiece of the ion implantation system;

calibrating the AEF dose cup during an implant set-up process to establish an ion current proportionality constant relative to the profile cup;

assuming an initial scan velocity of the workpiece past the ion beam;

implanting a region of the workpiece with an ion beam using the ion implantation system and the established ion current proportionality constant while measuring ion beam current at the AEF dose cup in the ion implantation system;

measuring the ion current associated with the implanted workpiece; and determining a scan velocity compensation according to the initial scan velocity, the measured ion beam current at the AEF dose cup, the ion current proportionality constant, and a desired dose level.

* * * * *